United States Patent [19]

Wong

[11] Patent Number: 5,358,907
[45] Date of Patent: Oct. 25, 1994

[54] METHOD OF ELECTROLESSLY DEPOSITING METALS ON A SILICON SUBSTRATE BY IMMERSING THE SUBSTRATE IN HYDROFLUORIC ACID CONTAINING A BUFFERED METAL SALT SOLUTION

[75] Inventor: Kaiser H. Wong, Torrance, Calif.

[73] Assignee: Xerox Corporation, Stamford, Conn.

[21] Appl. No.: 58,891

[22] Filed: May 10, 1993

Related U.S. Application Data

[63] Continuation of Ser. No. 852,884, Mar. 17, 1992, abandoned, which is a continuation of Ser. No. 546,125, Jun. 28, 1990, abandoned, which is a continuation-in-part of Ser. No. 472,132, Jan. 30, 1990, abandoned.

[51] Int. Cl.$^5$ ............................................. H01L 21/02
[52] U.S. Cl. ................................... 437/230; 437/245; 156/659.1; 427/98; 427/123; 427/309; 427/376.6; 427/436; 427/437
[58] Field of Search ............... 427/437, 98, 123, 309, 427/376.6, 436; 437/230, 245; 156/659.1

[56] References Cited

U.S. PATENT DOCUMENTS

| | | | |
|---|---|---|---|
| 4,089,993 | 5/1978 | Shirahata et al. | 427/129 |
| 4,576,689 | 3/1986 | Makkaev et al. | 204/20 |
| 4,634,619 | 1/1987 | Lindsay | 427/97 |

OTHER PUBLICATIONS

Zwicker et al., "Anisotropic Etching of Silicon Using Electrochemical Displacement Reactions", Symposium Volue of the Electrochemical Society pp. 315–326 1973.
Zwicker et al., "The Growth of Silver and Copper Single Crystals on Silicon and the Selective Removal of Silicon by Electrochemical Displacement," Acta Electronic vol. 16 No. 4 pp. 331–338 1973.

*Primary Examiner*—Shrive Beck
*Assistant Examiner*—Benjamin L. Utech
*Attorney, Agent, or Firm*—Nola Mae McBain

[57] ABSTRACT

A thin layer of Class 1B, IIB, IIIA, IVB, VB, VIB, VIIB or VIIIB metal is deposited on silicon or a silicon-based compound by immersion in a buffered metallic salt bath containing a hydrofluoric acid etchant followed by an electroless plating bath to build up the metal thickness. This process can also be used to pattern deposited metal on silicon or a silicon-based compound. An additional use of this process is to form metal silicides out of the deposited metal.

33 Claims, 1 Drawing Sheet

METHOD OF ELECTROLESSLY DEPOSITING METALS ON A SILICON SUBSTRATE BY IMMERSING THE SUBSTRATE IN HYDROFLUORIC ACID CONTAINING A BUFFERED METAL SALT SOLUTION

This application is a continuation of a copending U.S. application, Ser. No. 07/852,884 filed on Mar. 17, 1992 now abandoned which is a continuation of a U.S. application, Ser. No. 07/546,125 filed on Jun. 28, 1990 now abandoned, which is a continuation in part of a U.S. application, Ser. No. 07/472,132 filed on Jan. 30, 1990 now abandoned.

BACKGROUND OF THE INVENTION

Current electroless metal baths cannot deposit metal on silicon or silicon-based compounds because silicon, as a semiconductor, has no catalytic activity for metal deposition. As an example, in order to deposit copper on silicon, the silicon surface is first immersed in a sensitizing bath, then metallized with a thin layer of palladium or other non-precious metal in a separate activation bath, followed by depositing copper over the palladium or other metal in an electroless plating bath. This method of metallization is both costly and involves many steps of processing.

The alternative method is sputter deposition of the metal on the silicon. This method requires expensive and complex process control to provide a uniform thickness of metal on the silicon.

Metal silicides are important in the electronics industry for chip fabrication. Polysilicon is used in chip fabrication to form self-aligned gates in CMOS technology and self-aligned emitters in bipolar technology. However, even when heavily doped, polysilicon is a poor conductor due to its high resistivity. The high resistivity of polysilicon makes it unsuitable for local interconnects. Metal silicides circumvent this problem by allowing the deposition of certain metals on polysilicon. The polysilicon can be used for the gate or emitter and then converted into a metal silicide which has a much lower resistivity.

A copper nitrate ($Cu(NO_3)_2$) and ammonium fluoride ($NH_4F$) solution has been proposed as a means to deposit a thin layer of copper on silicon in a pair of articles by Zwicker and Kurtz, (Walter K. Zwicker and Stewart K. Kurtz, "The growth of silver and copper single crystals on silicon and the selective removal of silicon by electrochemical displacement," *Acta Electronica*, Vol. 16, No. 4, pp 331–338 (1973) and Walter K. Zwicker and Stewart K. Kurtz, "Anisotropic Etching of Silicon using Electrochemical Displacement Reactions," Second International Symposium on Silicon Material Science and Technology, *Symposium Volume of the Electrochemical Society, Spring Meeting—Chicago*, pp. 315–326, 1973.)

However, as the articles readily admit, the copper nitrate-ammonium fluoride solution causes flaking or blistering of the deposited copper on the silicon indicating a lack of adhesion between the copper and the silicon. Also, the copper can never be completely deposited over any meaningfully large area of silicon. And the deposits themselves tend to be non-uniform with no preferred orientation and ill-defined habits. Furthermore, this particular solution precipitates copper fluoride ($CuF_2$).

A cupric chloride ($CuCl_2$) and stannous fluoroborate ($Sn(BF_4)_2$) colloidal catalytic composition is used as an intermediate step in an electroless metal deposition process in U.S. Pat. No. 4,634,619. However, this particular method requires an initial essential step of immersion in a polyelectrolyte pre-wetting bath, which substitutes for the traditional sensitizing bath, to allow the metal plating of a dielectric substrate.

Similar problems arise when attempting to fabricate patterned metal, such as metal conductor lines, on silicon or silicon compound substrates.

It is an object of this invention to provide a means of depositing metal on silicon.

It is another object of this invention to provide a means of fabricating patterned metal on silicon.

It is another object of this invention to provide a means of fabricating metal silicides on silicon.

SUMMARY OF THE INVENTION

According to this invention, a thin later of metal is first deposited on a silicon compound wafer by a buffered metal salt bath. The wafer is then immersed in an electroless plating bath to build up the metal thickness. This metallization method has been shown to be economical, simple and easy to control.

Similarly, patterned metal can be fabricated on silicon or silicon-based compound substrates using the additive method by depositing a thin layer of metal on areas of the substrate not covered with photoresist. The resulting material is then immersed in an electroless metal plating bath to build up the metal thickness. This metallization process has been demonstrated as an economical, simple and easy to control method with widespread applications in the electronics field.

Other objects and attainments, together with a fuller understanding of the invention, will become apparent and appreciated by referring to the following description and claims taken in conjunction with the accompanying drawings.

DESCRIPTION OF THE PREFERRED EMBODIMENT

Figure 1:
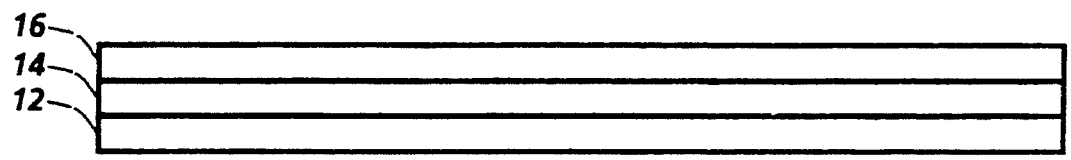
FIG. 1 is a schematic illustration of a side elevation of layers of metal deposited on a silicon wafer formed according to this invention.

Reference is now made to FIG. 1 wherein there is shown a metal coated semiconductor wafer 10 comprising a semiconductor substrate 12 of silicon (Si). A silicon substrate is used merely for the purpose of example, silicon or polysilicon, both amorphous or crystalline, both doped or undoped, will also work.

The silicon substrate is initially cleaned in a silicate based alkaline cleaner solution in an ultrasonic bath at 60° C. for 15 minutes. The substrate is then cut invo smaller individual wafer sample pieces with an approximate size of 2 to 3 square centimeters.

The silicon wafers are cleaned again in the silicate based alkaline solution in the ultrasonic bath at 60° C. for 5 minutes.

The deposition rate of the metal must be controlled in order to the process to work correctly. If the deposition rate of the metal is high, the metal will deposit in a very thick layer on the silicon wafer. An initial deposition of a thick layer will not adhere to the silicon since the tensile stress of the copper to copper bonds is greater than the copper to silicon bonds in the thick copper coating on the silicon substrate. The blistering will manifest itself at the copper/fluoride bath state of this process or, later, when the silicon wafers are immersed in an electroless copper plating bath, even though the lack of adhesion and tensile stress problems may have occurred in the earlier immersion step. Electroless copper plating baths provide less tensile stress to the copper coating and therefore allow a thicker coating to be deposited after the initial coating step.

The deposition rate of the metal is controlled by several factors such as ph of the solution, temperature of the solution, and concentration of the metal ions within the solution.

The molarity of the metal ions in the plating solution has the largest impact on the deposition rate. A solution with a high molarity will deposit metal very quickly resulting in flaking, blistering and peeling due to thickness of the metal layer even when the silicon wafer is immersed for a very short time. Therefore, the molarity of the metal ions must be kept low.

Temperature of the solution also has a large impact on the deposition rate. The metal will deposit faster in a warm solution than in a cool solution. Therefore, it is important to regulate the temperature of the solution to insure the deposition of a thin layer that will not flake, blister, or peel from the silicon wafer.

The ph of the solution will also affect the deposition rate of the metal. An optimum range of between 4.0 and 4.5 has been used in these experiments. A metallic salt that is reasonably soluble and a weak oxidizing agent was used to prevent ph shifting of the solution that would occur if a metallic salt that is a strong oxidizing agent was used. Additionally, a buffer was used to further stabilize the ph of the solution.

Further, the standard electrode potential of the metal involved must be less than the reaction potential of the silicon reaction $$SiF_6^{2-} \rightleftharpoons Si^{4+} + 6F^-$$

which is 1.24 volts, or the reaction will not complete. Examples of appropriate metallic salts include the chlorides of class VIII metals and the sulfates of class 1B metals. Class VIII metals include iron (Fe), nickel (Ni), Palladium (Pd), and others. Class 1B metals include copper (Cu), silver (Ag), and gold (Au). This process is not limited to these metal salts; they are used as examples only.

For the purpose of this example using Classes 1B, IIB, IIIA metals, such as Class 1B copper, the buffered metal salt bath is prepared by dissolving cupric sulfate pentahydrate ($CuSO_4 5H_2O$) in ammonium acid fluoride ($NH_4F$ HF). In the resulting copper/fluoride bath the hydrofluoric acid (HF) acts as an etchant on the silicon (Si) enabling the cupric sulfate ($CuSO_4$) to deposit a copper (Cu) coating on the silicon with the ammonium fluoride ($NH_4F$) serving as a buffer for the hydrofluoric acid (HF). Any buffer that stabilizes the ph at the desired value is acceptable. For the purposes of this example, 3.5 grams of cupric sulfate pentahydrate are dissolved per liter of an ammonium acid fluoride solution of one part of 49% HF to seven parts of 40% $NH_4F$ with a resulting molarity of 0.014M.

The silicon wafers are immersed in the buffered copper/fluoride solution at room temperature, or approximately 20° to 25° C. If the temperature of the solution is too high, the deposited copper will blister on the surface of the silicon. If the temperature of the solution is too low, the solution will crystallize and not effectively deposit the copper on the surface of the silicon. The buffered copper/fluoride solution should be slightly stirred while the silicon wafer samples are immersed to assist in the coating process.

The immersion time will determine the thickness of the copper deposited on the silicon surface. An insufficient immersion time will result in the silicon surface not being completely covered with deposited copper. An excessive immersion time will cause blistering of the copper deposited on the silicon surface due to the deposition of a thick layer as discussed previously.

Typically, for this solution, a two to three minute immersion time in the solution will completely cover the silicon wafers with a thin layer of copper coating 14 deposited to a thickness of approximately 1000 to 2000 angstroms, with 1000 to 1500 angstroms preferred. Less immersion time results in the silicon wafer not being completely covered with copper and what copper coating that is deposited being only approximately 100 to 200 angstroms thick. More immersion time results in a complete copper coating of approximately 3000 to 4000 angstroms which either has blistered or will blister during the following electroless copper plating bath.

To improve adhesion of the copper on the silicon, an optional additional step would be to initially immerse the silicon wafers in an ammonium acid fluoride ($NH_4F$ HF) solution, followed by immersion in the cupric sulfate pentahydrate/ammonium acid fluoride solution. This initial immersion in the ammonium acid fluoride solution will allow the hydrofluoric acid (HF) to begin to act as an etchant on the silicon (Si) substrate with the ammonium fluoride ($NH_4F$) serving as a buffer for the hydrofluoric acid (HF). The ammonium acid fluoride solution would be one part of 49% HF to seven parts of 40% $NH_4F$ and the silicon wafers would be immersed for approximately half a minute.

The initial ammonium acid fluoride solution bath, by commencing the etching process before the cupric sulfate pentahydrate/ammonium acid fluoride bath, reduces the immersion time in the cupric sulfate pentahydrate ammonium acid fluoride solution needed to completely deposit the copper on the silicon surface.

Thus, after a half minute immersion in the ammonium acid fluoride solution, the silicon wafers would be immersed for approximately one to two minutes in the buffered copper/fluoride solution, using a 3.5 gram cupric sulfate pentahydrate per liter of ammonium acid fluoride solution, to completely cover the silicon wafers in a thin layer of copper coating 14 deposited to a thickness of approximately 1000 to 2000 angstroms, with 1000 to 1500 angstroms preferred.

After the half minute immersion in the ammonium acid fluoride solution, if a higher content 8.0 gram cupric sulfate pentahydrate per liter of ammonium acid fluoride solution were used, the silicon wafers would be immersed for approximately less than a minute in the buffered copper/fluoride solution to completely cover the silicon wafers in a thin layer of copper coating 14 deposited to a thickness of approximately 1000 to 2000 angstroms, with 1000 to 1500 angstroms preferred.

As can be seen from the two examples, the metal is plated at an optimum thickness very rapidly in these low molarity solutions. Any increase in deposition rates, much above those described, from changing the molarity, temperature, ph or other parameters, quickly results in a failure of the process to deposit a thin metal coating with good adhesion properties.

Once the thin layer of copper coating 14 has been deposited on the silicon wafer samples by the copper/fluoride bath, the silicon wafer samples are removed from that solution and immersed in a dilute (1 to 3 percent) solution of sulfuric acid ($H_2SO_4$) for approximately ten seconds. The dilute sulfuric acid solution removes any possible oxidation on the surface of the thin copper coating layer and, if necessary, reactivates the catalytic activity of the copper coating.

Then, an additional thicker layer of copper 16 is deposited on the silicon wafer samples by immersing the samples in an electroless copper both. Current electroless copper baths can deposit copper on copper because the metal copper has the necessary catalytic activity, unlike the semiconductor silicon.

Once the silicon wafer samples have been coated with a layer of copper from either just the copper/fluoride solution or from both the copper/fluoride solution and the electroless copper plating bath, further processing of the copper coated silicon wafers, as is known to those of skill in the art, is possible for a variety of uses in electronic circuitry, decorative plating or the like.

In a second embodiment of this process using Classes IVB, VB, VIB, VIIB, and VIIIB metals, such as Class VIII palladium, the buffered metal salt bath is prepared by dissolving palladium chloride ($PdCl_2$) in ammonium acid fluoride ($NH_4F$ HF). In the resulting palladium chloride bath the hydrofluoric acid (HF) acts as an etchant on the silicon (Si) enabling the palladium chloride ($PdCl_2$) to deposit a palladium (Pd) coating on the silicon with the ammonium fluoride ($NH_4F$) serving as a buffer for the hydrofluoric acid (HF). For the purposes of this example, 0.5 grams of palladium chloride are dissolved per liter of an ammonium acid fluoride solution of one part of 40% HF to seven parts of 40% $NH_4F$ with a resulting molarity of 0.0045M for palladium (Pd).

The silicon wafers are immersed in the buffered palladium chloride solution at room temperature, or approximately 20° to 25° C. If the temperature of the solution is too high, the deposited palladium will blister on the surface of the silicon. If the temperature of the solution is too low, the solution will crystallize and not effectively deposit the palladium on the surface of the silicon. The buffered palladium chloride solution should be slightly stirred while the silicon wafer samples are immersed to assist in the coating process.

The immersion time will determine the thickness of the palladium deposited on the silicon surface. An insufficient immersion time will result in the silicon surface not being completely covered with deposited palladium. An excessive immersion time will cause blistering of the palladium deposited on the silicon surface.

Typically, for this solution, a 20 to 30 second immersion time in the solution will completely cover the silicon wafers with a thin layer of palladium coating 14 deposited to a thickness of approximately 1000 to 2000 angstroms, with 1000 to 1500 angstroms preferred. Less immersion time results in the silicon wafer not being completely covered with palladium and what palladium coating that is deposited being only approximately 100 to 200 angstroms thick. More immersion time results in a complete palladium coating of approximately 3000 to 4000 angstroms which either has blistered or will blister during the following electroless palladium plating bath.

Once the thin layer of palladium coating 14 has been deposited on the silicon wafer samples by the palladium chloride bath, the silicon wafer samples are removed from that solution and immersed in a dilute (1 to 3 percent) solution of sulfuric acid ($H_2SO_4$) for approximately ten seconds. The dilute sulfuric acid solution removes any possible oxidation on the surface of the thin palladium coating layer and, if necessary, reactivates the catalytic activity of the palladium coating.

Then, an additional thicker layer of palladium 16 is deposited on the silicon wafer samples by immersing the samples in an electroless palladium plating bath. Current electroless palladium baths can deposit palladium on palladium because the metal palladium has the necessary catalytic activity, unlike the semiconductor silicon.

Or, a thicker layer of metal other than palladium 16 is deposited on the silicon wafer samples by immersing the samples in an electroless plating bath of some other metal. Current electroless baths can deposit metals on palladium because the metal palladium has the necessary catalytic activity, unlike the semiconductor silicon.

The solution can be made with or replenished by the use of commercially available palladium replenishers such as the Technic Inc. electroless palladium replenisher available from Technic Inc. located at 3265 N. Ridge Avenue, Arlinton Heights, Ill. Technic Inc. has several palladium replenishers, the replenisher used in these experiments is designated Solution A and is an aqueous solution of 3.98 grams of palladium per liter in ammonium hydroxide ($NH_4OH$). The exact formulation of Solution A is unkown since the formula is retained as a trade secrect by Technics Inc. The Palladium Replenisher becomes the source of the palladium ions in the solution. Standard electroless plating solutions are typically made using a concentrated metallic salt solution that is subsequently diluted. After the bath has been used one or more times, a replenisher is added to restore the concentration of the metal in the plating bath to replace any metal that has been plated out of the solution. It is convenient to use a replenisher to create a silicon plating solution since the replenisher is likely to be used in subsequent steps. In two experiments utilizing a relenisher, adhesion of the plated palladium and grain size of the plated palladium was improved when using at least some palladium replenisher in the plating solution.

In one experiment, 10 ml of Technic Inc. electroless palladium replenisher was added to a 1 liter solution made from 875 ml of buffer (ammonium fluoride $NH_4F$), 125 ml of hydrofluoric acid (HF) and 1.25 grams of palladium chloride ($PdCl_2$) for a molarity of 0.0046M of palladium. A doped polysilicon wafer was immersed in this solution for 9 seconds. After immersion in this solution, the doped silicon wafer was immersed in an electroless palladium bath for 1 minute. The adhesion of the plated palladium on the doped polysilicon wafer was good and the grain size of the plated palladium was smaller compared to the palladium plated in the solution not utilizing the palladium replenisher.

In a second experiment with palladium replenishers, 35 ml of Technic Inc. electroless palladium replenisher was added to 2000 ml of buffer (ammonium fluoride, $NH_4F$) for a resulting molarity of 0.00034M of palldium. A doped polysilicon wafer was immersed in this solution for 28 seconds and then followed by immersion in an electroless palladium bath for 1 minute. The reaction time is slowed considerably by the very weak concentrations of both the palladium ions and fluoride ions in the solution. The adhesion of the plated palladium on the doped polysilicon wafer was very good and the grain size of the plated palladium was visibly smaller compared to the palladium plated in the solution not utilizing the palladium replenisher.

Once the silicon wafer samples have been coated with a layer of palladium or some other metal from either just the palladium chloride solution or from both the palladium chloride solution and the electroless plating bath, further processing of the metal coated silicon wafers, as is known to those of skill in the art, is possible for a variety of uses in electronic circuitry, decorative plating or the like.

In wafer fabrication, metals have different reactions when they are sintered with silicon or polysilicon. Classes IVB, VB, VIB, VIIB, and VIII metals, such as palladium, form metal silicides when sintered with silicon or polysilicon. Classes IB, IIB, IIIA, metals, such as copper do not form metal silicides but diffuse through the silicon or polysilicon when sintered. Even when heavily doped, polysilicon is a poor conductor due to its high resistivity. The high resistivity of polysilicon makes it unsuitable as a conductive layer. Metal silicides which are conductive become an economical alternative as an additional conductive layer.

Areas of the silicon wafers can be coated with silicon nitrate ($Si_3N_4$) or silicon dioxide ($SiO_2$), not shown in the figures, to prevent copper deposition by the metal salt bath and the electroless plating bath. For example, it may be desired that the back and sides of the silicon wafers not be coated with copper.

Figure 2:
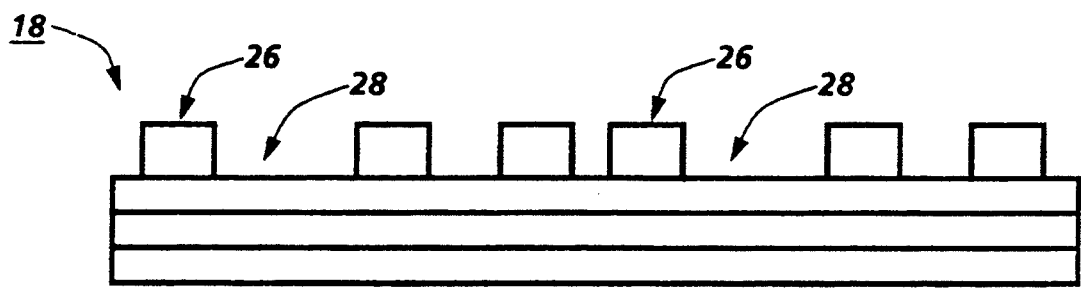
FIG. 2 is a schematic illustration of a side elevation of a photoresist pattern on a silicon substrate prior to metal being deposited by a buffered metal salt bath according to this invention.

The buffered metallic salt bath can also be used to fabricate patterned metal for electronic circuitry on silicon wafers. As shown in FIG. 2, semiconductor chip 18 has a semiconductor substrate 20 of silicon (Si).

A layer 22 of silicon dioxide ($SiO_2$), approximately 1 micron thick, is deposited on the substrate by chemical vapor deposition. An undoped polysilicon layer 24 with a thickness of approximately 2 microns is then chemically vapor deposited on the silicon dioxide layer. Undoped silicon can also be used instead of undoped polysilicon. The silicon dioxide and undoped polysilicon layers serve as an insulator between the metal conductor and the silicon semiconductor.

The undoped polysilicon layer is then coated with a commercially available photoresist. The photoresist coated substrate is then soft baked. A mask with the desired patterned design, in this example copper conductor lines, has been prepared and is aligned with the photoresist layer which is then exposed, the mask removed and the photoresist layer developed and hard baked, as is known to those of skill in the art.

A negative polyimide could be used in place of the photoresist with the only resulting change that the polyimide layer be cured at a higher temperature rather than hard baked as the final step in the process, as is known to those of skill in the art.

The resulting photoresist patterned layer 26 on the undoped polysilicon layer 24 is the negative or opposite of the patterned conductor lines desired. The surface 28 of the undoped polysilicon layer 24 is exposed after the photoresist has been removed after development and follows the pattern of the conductor lines desired. The patterned photoresist covered substrate is then cleaned in a silicate based alkaline cleaner solution in an ultrasonic bath at 55° to 60° C. for 10 minutes, followed by a de-ionized water rinse.

In this example, buffered copper/fluoride bath is prepared by dissolving cupric sulfate pentahydrate ($CuSO_4 5H_2O$) in ammonium acid fluoride ($NH_4FHF$). For the purposes of this example, 8.0 grams of cupric sulfate pentahydrate are dissolved per liter of a solution of one part of 40% HF to seven parts of 40% $NH_4F$ with a resulting molarity of 0.032M.

Figure 3:
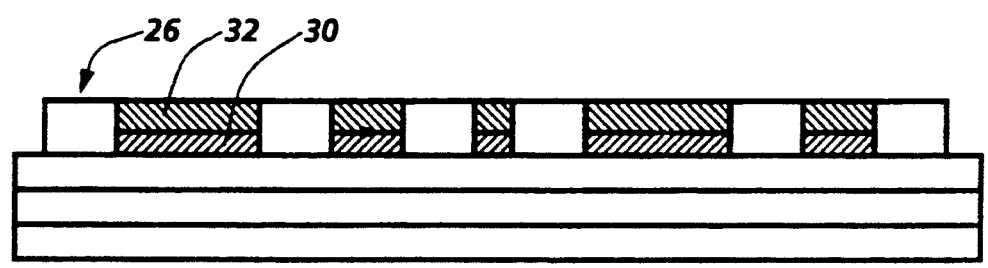
FIG. 3 is a schematic illustration of a side elevation of a photoresist pattern and an additive metal pattern on a silicon substrate after metal has been deposited by a buffered metal salt bath and an electroless copper bath according to this invention.

As shown in FIG. 3, the patterned photoresist covered substrate is then immersed in the buffered copper/fluoride solution at room temperature. The buffered copper/sulfide solution should be slightly stirred while the patterned photoresist covered substrate is immersed.

An approximately half minute immersion time in the solution will completely cover the exposed surface of the undoped polysilicon layer in a thin layer of copper coating 30 deposited to a thickness of approximately 1000 to 2000 angstroms. Less immersion time results in the silicon wafer not being completely covered with copper and what copper coating that is deposited being only approximately 100 to 200 angstroms thick. More immersion time results in a complete copper coating of approximately 3000 to 4000 angstroms which either has blistered or will blister during the following electroless copper plating bath.

The copper/fluoride bath does not deposit copper on the photoresist covered sections 26 of the substrate since the hydrofluoric acid (HF) does not etch photoresist and therefore the cupric sulfate ($CuSO_4$) cannot deposit copper.

Similarly, areas of the substrate can be coated with silicon nitrate ($Si_3N_4$) or silicon dioxide ($SiO_2$), not shown in the figures, to prevent copper deposition by the copper/fluoride bath and the electroless copper plating bath. For example, it may be desired that the back and sides of the substrate not be coated with copper.

As in the embodiment previously described in this text and shown in FIG. 1, an optional additional step would be to initially immerse the patterned photoresist covered substrate in an ammonium acid fluoride ($NH_4F$ HF) solution, followed by immersion in the cupric sulfate pentahydrate/ammonium acid fluoride solution.

The ammonium acid fluoride solution would be one part of 40% HF to seven parts of 40% $NH_4F$ and the patterned photoresist covered substrate would be immersed for approximately half a minute. After the half minute immersion in the ammonium acid fluoride solution, the patterned photoresist covered substrate would be immersed for approximately half a minute in the buffered copper/fluoride solution, using a 8.0 gram cupric sulfate pentahydrate per liter of ammonium acid fluoride solution, to completely cover the patterned photoresist covered substrate in a thin layer of copper coating 14 deposited to a thickness of approximately 1000 to 2000 angstroms, with 1000 to 1500 angstroms preferred.

The substrate with its photoresist and thin copper coating is then rinsed in deionized water, followed by immersion in a dilute (1 to 3 percent) solution of sulfuric acid ($H_2SO_4$) for approximately ten seconds, and then rinsed in de-ionized water. The dilute sulfuric acid solution removes any possible oxidation on the surface of the thin copper coating layer and, if necessary, reactivates the catalytic activity of the copper coating.

The photoresist and thin copper coated substrate is then immersed in an electroless plating bath for approximately 15 minutes or whatever duration is necessary for the desired thickness to deposit a second copper coating 32 on the thin layer 30 of copper from the copper/fluoride bath. The electroless copper plating bath does not deposit copper on the photoresist covered sections 26 of the substrate since the photoresist has no catalytic activity for copper deposition.

The substrate with its photoresist and two-layered copper coating is then rinsed in de-ionized water.

Figure 4:
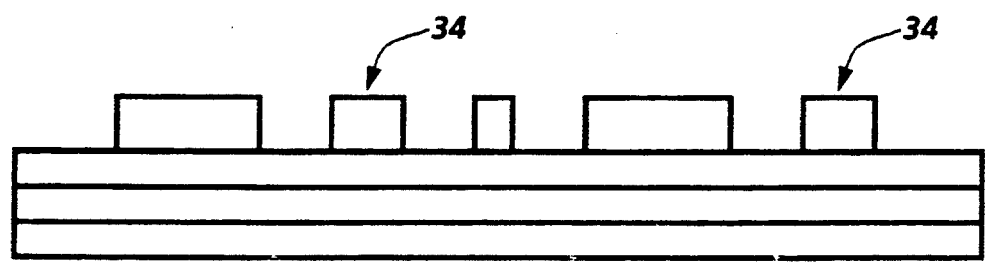
FIG. 4 is a schematic illustration of a side elevation of patterned metal conductor lines on a silicon substrate formed according to this invention.

As shown in FIG. 4, the photoresist is then stripped away from the substrate by means known to those of ordinary skill in the art leaving only the patterned copper conductor lines 34. The photoresist had been coated on the undoped polysilicon layer in the negative or opposite of the patterned conductor lines desired. Thus, by the additive method, the copper coating in the exposed portions of the substrate not coated with photoresist will form the patterned conductor lines desired.

In the case of a polyimide coated substrate, after the patterned copper conductor lines have been deposited, the polyimide can either be left on the substrate or removed.

Once the substrate has been coated with a layer of patterned copper from either just the copper/fluoride solution or from both the copper/fluoride solution and the electroless copper plating bath, further processing, as is known to those of skill in the art, is possible for a variety of uses in electronic circuitry or the like.

Or, in a second example, a buffered palladium chloride bath is prepared by dissolving palladium chloride ($PdCl_2$) in ammonium acid fluoride ($NH_4F \cdot HF$). For the purposes of this example, 0.5 grams of palladium chloride are dissolved per liter of a solution of one part of 49% HF to seven parts of 40% $NH_4F$ with a resulting molarity of 0.00625M.

As shown in FIG. 3, the patterned photoresist covered substrate is then immersed in the buffered palladium chloride solution at room temperature. The buffered palladium chloride solution should be slightly stirred while the patterned photoresist covered substrate is immersed.

An approximately 20 to 30 second immersion time in the solution will completely cover the exposed surface of the undoped polysilicon layer in a thin layer of palladium coating 30 deposited to a thickness of approximately 1000 to 2000 angstroms. Less immersion time results in the silicon wafer not being completely covered with palladium and what palladium coating that is deposited being only approximately 100 to 200 angstroms thick. More immersion time results in a complete palladium coating of approximately 3000 to 4000 angstroms which either has blistered, or will blister during the following electroless plating bath.

The palladium chloride bath does not deposit palladium on the photoresist covered sections 26 of the substrate since the hydrofluoric acid (HF) does not etch photoresist and therefore the palladium chloride ($PdCl_2$) cannot deposit palladium.

Similarly, areas of the substrate can be coated with silicon nitrate ($Si_3N_4$) or silicon dioxide ($SiO_2$), not shown in the figures, to prevent palladium deposition by the palladium chloride bath and the electroless plating bath. For example, it may be desired that the back and sides of the substrate not be coated with copper.

The photoresist and thin palladium coated substrate is then immersed in an electroless plating bath for approximately 15 minutes or whatever duration is necessary for the desired thickness to deposit a second metal coating 32 on the thin layer 30 of palladium from the palladium chloride bath. The electroless plating bath does not deposit metal on the photoresist covered sections 26 of the substrate since the photoresist has no catalytic activity for metal deposition.

The substrate with its photoresist and two-layered metal coating is then rinsed in de-ionized water.

As shown in FIG. 4, the photoresist is then stripped away from the substrate by means known to those of ordinary skill in the art leaving only the patterned metal conductor lines 34. The photoresist had been coated on the undoped polysilicon layer in the negative or opposite of the patterned conductor lines desired. Thus, by the additive method, the metal coating in the exposed portions of the substrate not coated with photoresist will form the patterned conductor lines desired.

In the case of a polyimide coated substrate, after the patterned metal conductor lines have been deposited, the polyimide can either be left on the substrate or removed.

Once the substrate has been coated with a layer of patterned metal from either just the metal palladium chloride solution or from both the copper/fluoride palladium chloride solution and the electroless plating bath, further processing, as is known to those of skill in the art, is possible for a variety of uses in electronic circuitry or the like. One such use would be sintering to form metal silicides.

While the invention has been described in conjunction with specific embodiments, it is evident to those skilled in the art that many alternatives, modifications and variations will be apparent in light of the foregoing description. Accordingly, the invention is intended to embrace all such alternatives, modifications and variations as fall within the spirit and scope of the appended claims.

I claim:

1. A method of deposition of classes IB, IIB, IIIA, IVB, VB, VIB, VIIB, or VIII metals on a solid silicon compound member comprising the step of:

depositing an approximately from 1000 angstroms to 2000 angstroms thick layer of metal of classes IB, IIB, IIIA, IVB, VB, VIB, VIIB, or VIII on said solid silicon compound member by immersing said solid silicon compound member in a buffered aqueous salt solution comprising an etchant of hydrofluoric acid, a buffer and a dissolved metallic salt, wherein said metallic salt comprises a metal of classes IB, IIB, IIIA, IVB, VB, VIB, VIIB, or VIII metals, and wherein said buffered aqueous salt solution has a molarity of less than about 0.032M of metal cations from said dissolved metallic salt.

2. The method of deposition of classes IB, IIB, IIIA, IVB, VB, VIB, VIIB, or VIII metals on a solid silicon compound member of claim 1 comprising the further step of:

immersing said solid silicon compound member coated with said approximately from 1000 angstroms to 2000 angstroms thick layer in an electroless plating bath and depositing metal of classes IB, IIB, IIIA, IVB, VB, VIB, VIIB, and VIII on said approximately from 1000 angstroms to 2000 angstroms thick layer.

3. The method of deposition of classes IB, IIB, IIIA, IVB, VB, VIB, VIIB, or VIII metals on a solid silicon compound member of claim 1 wherein said solid silicon compound member is chosen from the group consisting of: crystalline doped silicon, crystalline undoped silicon, crystalline doped polysilicon, crystalline undoped polysilicon, amorphous doped silicon, amorphous undoped silicon, amorphous doped polysilicon, and amorphous undoped polysilicon.

4. The method of deposition of classes IB, IIB, IIIA, IVB, VB, VIB, VIIB, or VIII metals on a solid silicon compound member of claim 3 wherein said buffered aqueous salt solution is a buffered copper/fluoride solution comprising cupric sulfate and ammonium acid fluoride.

5. The method of deposition of classes IB, IIB, IIIA, IVB, VB, VIB, VIIB, or VIII metals on a solid silicon compound member of claim 4 wherein said solid silicon compound member is initially immersed in an ammonium acid fluoride solution prior to immersion of said solid silicon compound member in said buffered copper/fluoride solution.

6. The method of deposition of classes IB, IIB, IIIA, IVB, VB, VIB, VIIB, or VIII metals on a solid silicon compound member of claim 3 wherein said buffered aqueous salt solution is a buffered palladium/chloride solution comprising palladium chloride and ammonium acid fluoride.

7. The method of deposition of classes IB, IIB, IIIA, IVB, VB, VIB, VIIB, or VIII metals on a solid silicon compound member of claim 6 wherein said solid silicon compound member is initially immersed in an ammonium acid fluoride solution prior to immersion of said solid silicon compound member in said buffered palladium/chloride solution.

8. The method of deposition of classes IB, IIB, IIIA, IVB, VB, VIB, VIIB, or VIII metals on a solid silicon compound member of claim 3 comprising the further step of:
immersing said silicon compound coated with said approximately from 1000 angstroms to 2000 angstroms thick layer in an electroless plating bath and depositing metal of classes IB, IIB, IIIA, IVB, VB, VIB, VIIB, and VIII on said approximately from 1000 angstroms to 2000 angstroms thick layer.

9. The method of deposition of classes IB, IIB, IIIA, IVB, VB, VIB, VIIB, or VIII metals on a solid silicon compound member of claim 3 wherein said buffered aqueous salt solution includes ammonium acid fluoride.

10. The method of deposition of classes IB, IIB, IIIA, IVB, VB, VIB, VIIB, or VIII metals on a solid silicon compound member of claim 3 wherein said metallic salt is a copper salt.

11. The method of deposition of classes IB, IIB, IIIA, IVB, VB, VIB, VIIB, or VIII metals on a solid silicon compound member of claim 3 wherein said metallic salt is a palladium salt.

12. The method of deposition of classes IB, IIB, IIIA, IVB, VB, VIB, VIIB, or VIII metals on a solid silicon compound member of claim 1 wherein said buffered aqueous salt solution includes ammonium acid fluoride.

13. The method of deposition of classes IB, IIB, IIIA, IVB, VB, VIB, VIIB, or VIII metals on a solid silicon compound member of claim 1 wherein said metallic salt is a copper salt.

14. The method of deposition of classes IB, IIB, IIIA, IVB, VB, VIB, VIIB, or VIII metals on a solid silicon compound member of claim 1 wherein said metallic salt is a palladium salt.

15. The method of deposition of classes IB, IIB, IIIA, IVB, VB, VIB, VIIB, or VIII metals on a solid silicon compound member of claim 1 wherein the metallic salt is provided by using a replenisher.

16. A method of fabricating patterned metal of classes IB, IIB, IIIA, IVB, VB, VIB, VIIB, or VIII on a solid silicon compound member comprising the steps of:
depositing an insulatng layer on said solid silicon compound member,
coating said insulating layer of said sold silicon compound member with photoresist or polyimide,
exposing and developing said photoresist or polyimide,
depositing an approximately from 1000 angstroms to 2000 angstroms thick layer metal of classes IB, IIB, IIIA, IVB, VB, VIB, VIIB, or VIII on said insulating layer in the areas of said insulating layer not covered by said photoresist or polyimide to form a pattern by immersing sad solid silicon compound member in a buffered aqueous salt solution comprising an etchant of hydrofluoric acid, a buffer and a dissolved metallic salt, wherein said metallic salt comprises a metal of classes IB, IIB, IIIA, IVB, VB, VIB, VIIB, or VIII metals, and wherein said buffered aqueous salt solution has a molarity of less than about 0.032M of metal cations from said dissolved metallic salt,
removing said photoresist or polyimide leaving patterned metal of classes IB, IIB, IIIA, IVB, VB, VIB, VIIB, or VIII on said insulating layer of said solid silicon compound member.

17. The method of fabricating patterned metal of classes IB, IIB, IIIA, IVB, VB, VIB, VIIB, or VIII on a solid silicon compound member of claim 16 further comprising the step of:
depositing metal of classes IB, IIB, IIIA, IVB, VB, VIB, VIIB, and VIII on said insulating layer in the areas of said insulating layer not covered by said photoresist or polyimide by immersing sad solid silicon compound member in an electroless plating bath.

18. The method of fabricating patterned metal of classes IVB, VB, VIB, VIIB, or VIII on a solid silicon compound member of claim 17 wherein:
said solid silicon compound member comprises silicon or polysilicon, and
a further step is performed to sinter said metal of classes IVB, VB, VIB, VIIB, and VIII deposited on the solid silicon compound member to form a metal silicide.

19. The method of fabricating patterned metal of classes IB, IIB, IIIA, IVB, VB, VIB, VIIB, or VIII on a solid silicon compound member of claim 16 wherein said solid silicon compound member is chosen from the group consisting of: crystalline doped silicon, crystalline undoped silicon, crystalline doped polysilicon, crystalline undoped polysilicon, amorphous doped silicon, amorphous undoped silicon, amorphous doped polysilicon, and amorphous undoped polysilicon.

20. The method of fabricating patterned metal of classes IB, IIB, IIIA, IVB, VB, VIB, VIIB, or VIII metals on a solid silicon compound member of claim 19 wherein said buffered aqueous salt solution is a buffered copper/fluoride solution comprising cupric sulfate pentahydrate and ammonium acid fluoride.

21. The method of fabricating patterned metal of classes IB, IIB, IIIA, IVB, VB, IB, VIIB, or VIII metals on a solid silicon compound member of claim 20, wherein said solid silicon compound member is initially immersed in an ammonium acid fluoride solution prior to immersion of said solid silicon compound member in said buffered copper/fluoride solution.

22. The method of fabricating patterned metal of classes IB, IIB, IIIA, IVB, VB, VIB, VIIB, or VIII metals on a solid silicon compound member of claim 19 wherein said buffered aqueous salt solution is a buffered palladium/chloride solution comprising palladium chloride and ammonium acid fluoride.

23. The method of fabricating patterned metal of classes IB, IIB, IIIA, IVB, VB, VIB, VIIB, or VIII metals on a solid silicon compound member of claim 22 wherein said solid silicon compound member is initially immersed in an ammonium acid fluoride solution prior to immersion of said solid silicon compound member in said buffered palladium/chloride solution.

24. The method of fabricating patterned metal of classes IB, IIB, IIIA, IVB, VB, VIB, VIIB, or VIII deposition on a solid silicon compound member of claim 19 further comprising the step of:
depositing metal of classes IB, IIB, IIIA, IVB, VB, VIB, VIIB, and VIII on said insulating layer in the areas of said insulating layer not covered by said photoresist or polyimide by immersing said solid silicon compound member in an electroless plating bath.

25. The method of fabricating patterned metal of classes IB, IIB, IIIA, IVB, VB, VIB, VIIB, or VIII deposition on a solid silicon compound member of claim 19 wherein said buffered aqueous salt solution includes ammonium acid fluoride.

26. The method of fabricating patterned metal of classes IB, IIB, IIIA, IVB, VB, VIB, VIIB, or VIII metals on a solid silicon compound member of claim 19 wherein said metallic salt is a copper salt.

27. The method of fabricating patterned metal of classes IB, IIB, IIIA, IVB, VB, VIB, VIIB, or VIII metals on a solid silicon compound member of claim 19 wherein said metallic salt is a palladium salt.

28. The method of fabricating patterned metal of classes IB, IIB, IIIA, IVB, VB, VIB, VIIB, or VIII on a solid silicon compound member of claim 16 wherein said buffered aqueous salt solution includes ammonium acid fluoride.

29. The method of fabricating patterned metal of classes IB, IIB, IIIA, IVB, VB, VIB, VIIB, or VIII on a solid silicon compound member of claim 16 wherein said insulating layer comprises a layer of undoped polysilicon.

30. The method of fabricating patterned metal of classes IB, IIB, IIIA, IVB, VB, VIB, VIIB, or VIII metals on a solid silicon compound member of claim 16 wherein said metallic salt is a copper salt.

31. The method of fabricating patterned metal of classes IB, IIB, IIIA, IVB, VB, VIB, VIIB, or VIII metals on a solid silicon compound member of claim 16 wherein said metallic salt is a palladium salt.

32. The method of fabricating patterned metal of classes IVB, VB, VIB, VIIB, or VIII on a solid silicon compound member of claim 16 wherein
said solid silicon compound member comprises silicon or polysilicon,
comprising the further step of sintering said metal of classes IVB, VB, VIB, VIIB, and VIII deposited on the solid silicon compound member to form a metal silicide.

33. The method of deposition of classes IB, IIB, IIIA, IVB, VB, VIB, VIIB, or VIII metals on a solid silicon compound member of claim 16 wherein the metallic salt is provided by using a replenisher.

* * * * *